United States Patent
Miyata et al.

(10) Patent No.: US 9,863,999 B2
(45) Date of Patent: Jan. 9, 2018

(54) CIRCUIT AND METHOD FOR INSPECTING SEMICONDUCTOR DEVICE

(71) Applicant: DENSO CORPORATION, Kariya, Aichi-pref. (JP)

(72) Inventors: Masanori Miyata, Kariya (JP); Takafumi Arakawa, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/318,035

(22) PCT Filed: Jun. 23, 2015

(86) PCT No.: PCT/JP2015/003133
§ 371 (c)(1),
(2) Date: Dec. 12, 2016

(87) PCT Pub. No.: WO2015/198589
PCT Pub. Date: Dec. 30, 2015

(65) Prior Publication Data
US 2017/0131344 A1    May 11, 2017

(30) Foreign Application Priority Data

Jun. 26, 2014  (JP) ................................ 2014-131290

(51) Int. Cl.
*G01R 31/02* (2006.01)
*G01R 31/26* (2014.01)
(Continued)

(52) U.S. Cl.
CPC ..... *G01R 31/2633* (2013.01); *G01R 31/3004* (2013.01); *G01R 31/31924* (2013.01); *G01R 31/2884* (2013.01)

(58) Field of Classification Search
CPC .......... G01R 33/2633; G01R 31/2632; G01R 31/2635; G01R 31/263; G01R 31/006; G01R 31/31924; G01R 31/2884
(Continued)

(56) References Cited

U.S. PATENT DOCUMENTS 4,851,769 A * 7/1989 Carpenter ............ G01R 31/261
                                                        324/110
5,461,908 A * 10/1995 Armstrong ............... F02P 17/02
                                                        324/503
(Continued)

FOREIGN PATENT DOCUMENTS

JP    H06-291323 A    10/1994
JP    H10-224197 A    8/1998
(Continued)

*Primary Examiner* — Thang Le
(74) *Attorney, Agent, or Firm* — Posz Law Group, PLC

(57) ABSTRACT

A circuit for inspecting a semiconductor device includes: the semiconductor device that is an object to be inspected and includes a diode; a protection element that is connected in series with the semiconductor device and includes a protection diode having higher breakdown resistance than the diode; a switch that includes a switching element connected in series with the semiconductor device and the protection element; and a coil that provides a loop path together with the semiconductor device and the protection element when the switching element is turned off. Even when the semiconductor device including the diode is broken, an inspection device is restricted from being damaged.

3 Claims, 5 Drawing Sheets

(51) Int. Cl.
  *G01R 31/30*  (2006.01)
  *G01R 31/319*  (2006.01)
  *G01R 31/28*  (2006.01)

(58) Field of Classification Search
  USPC .......................................... 324/762.01–762.1
  See application file for complete search history.

(56) References Cited

U.S. PATENT DOCUMENTS

| | | | | |
|---|---|---|---|---|
| 5,892,342 A * | 4/1999 | Friedlander | ............ | B60L 3/0023 |
| | | | | 318/139 |
| 6,147,498 A * | 11/2000 | Sumiya | .................. | G01R 31/06 |
| | | | | 324/415 |
| 6,483,431 B2 * | 11/2002 | Bert | ....................... | H01H 9/167 |
| | | | | 340/509 |
| 9,019,671 B2 * | 4/2015 | De Boet | ................ | H03G 11/02 |
| | | | | 257/328 |
| 2003/0016711 A1 * | 1/2003 | Crawford | ................ | H01S 5/042 |
| | | | | 372/38.02 |
| 2006/0238214 A1 * | 10/2006 | Itoh | .................... | G01R 31/2884 |
| | | | | 324/762.01 |
| 2009/0322372 A1 * | 12/2009 | Stenzel | .............. | G01R 31/2822 |
| | | | | 324/762.07 |
| 2012/0032710 A1 | 2/2012 | Tsukada | | |
| 2013/0027067 A1 * | 1/2013 | Schwartz | ........... | G01R 31/2621 |
| | | | | 324/750.01 |
| 2013/0241584 A1 * | 9/2013 | Mao | ....................... | G01R 31/00 |
| | | | | 324/750.01 |
| 2014/0347070 A1 * | 11/2014 | Scheuschner | ........... | G01R 31/08 |
| | | | | 324/543 |

FOREIGN PATENT DOCUMENTS

| | | |
|---|---|---|
| JP | 2008-164364 A | 7/2008 |
| JP | 2009-145302 A | 7/2009 |
| JP | 2010-127720 A | 6/2010 |
| JP | 2012-229971 A | 11/2012 |

\* cited by examiner

CIRCUIT AND METHOD FOR INSPECTING SEMICONDUCTOR DEVICE

CROSS REFERENCE TO RELATED APPLICATIONS

This application is a U.S. national stage application of International Patent Application No. PCT/JP2015/003133 filed on Jun. 23, 2015 and is based on Japanese Patent Application No. 2014-131290 filed on Jun. 26, 2014, the disclosure of which is incorporated herein by reference.

TECHNICAL FIELD

The present disclosure relates to a circuit and a method for inspecting a semiconductor device including a diode.

BACKGROUND

For example, as the above kind of inspection circuit, the following inspection circuit has been conventionally proposed in patent literature 1. In the inspection circuit of the patent literature 1, a switch is arranged between a power source and a semiconductor device that is an object to be inspected (hereinafter, simply referred to as a DUT), and an ammeter measuring current flowing in the DUT is arranged. Also, a controller controlling on and off of the switch based on a measurement result of the ammeter is arranged.

In such an inspection circuit, when the measurement result of the ammeter is greater than a predetermined threshold, the controller determines that the DUT is broken and turns off the switch. That is, when the DUT is broken and large current flows in the DUT, the switch is turned off by the controller. As such, when the DUT is broken, an inspection device such as a stage or a probe for inspecting the DUT is restricted from being damaged.

PATENT LITERATURE

Patent literature 1: JP 2008-164364 A

SUMMARY

In the above inspection circuit, however, there is a time period between when the DUT is actually broken and when the DUT is determined to be broken, and there is a time period between when the DUT is determined to be broken and when the switch is turned off. Therefore, there is a possibility that large current flows in the DUT before the switch is turned off. Especially, when the DUT includes a diode, there is a possibility that the inspection device is damaged due to large increase rate (di/dt) of short-circuit current.

It is an object of the present disclosure to provide a circuit and a method for inspecting a semiconductor device capable of restricting an inspection device from being damaged when the DUT including a diode is broken.

According to a first aspect of the present disclosure, a circuit for inspecting a semiconductor device includes: the semiconductor device (DUT) that is an object to be inspected and includes a diode; a protection element that is connected in series with the DUT and includes a protection diode having higher breakdown resistance than the diode; a switch that includes a switching element connected in series with the DUT and the protection element; and a coil that provides a loop path together with the DUT and the protection element when the switching element is turned off.

According to the first aspect of the present disclosure, the protection diode having higher breakdown resistance than the diode is arranged. Even when the diode is broken, an absolute value of short-circuit current flowing in the DUT is restricted from increasing and an inspection device is restricted from being damaged.

According to a second aspect of the present disclosure, a method for inspecting a semiconductor device (DUT) that is an object to be inspected and includes a diode includes: arranging a protection element and a switch in series with the DUT, the protection element including a protection diode having higher breakdown resistance than the diode, and the switch including a switching element; arranging a coil to provide a loop path together with the DUT and the protection element when the switching element is turned off; and repeating turning on and off of the switching element.

According to the second aspect of the present disclosure, the protection diode having higher breakdown resistance than the diode is arranged. Even when the diode is broken, an absolute value of short-circuit current flowing in the DUT is restricted from increasing and an inspection device is restricted from being damaged.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Hereinafter, embodiments of the present disclosure will be described with reference to the drawings. In the following embodiments, parts that are the same as each other or parts that are similar to each other will be designated by the same symbols.

(First Embodiment)

Figure 1:
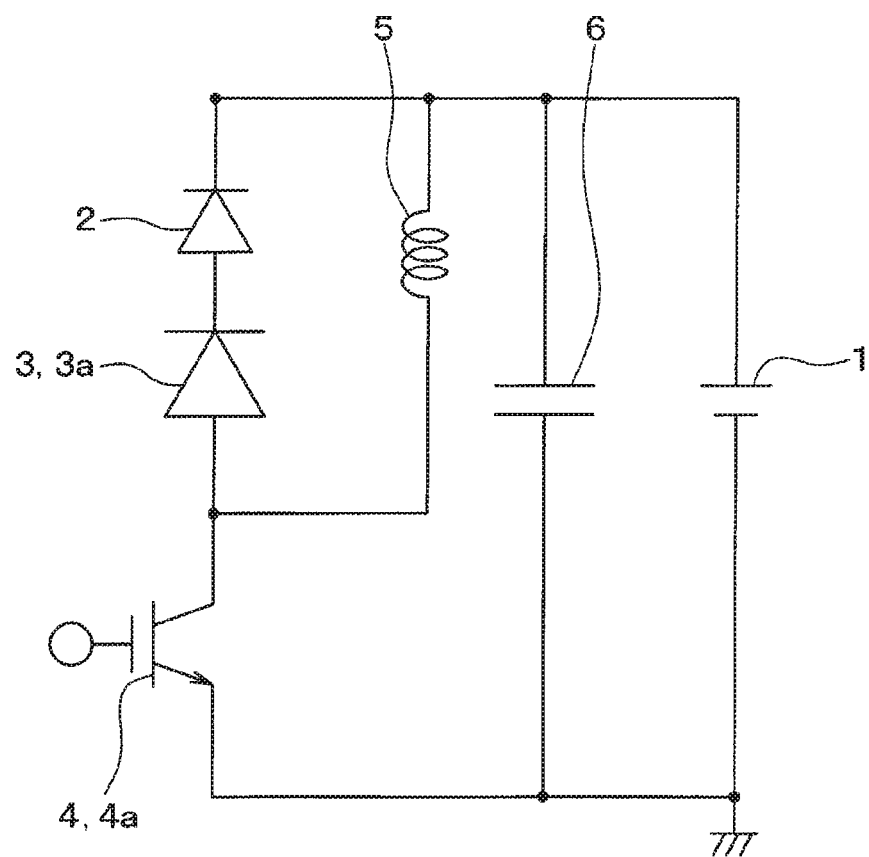
FIG. 1 is a diagram illustrating an inspection circuit according to a first embodiment of the present disclosure.

A first embodiment of the present disclosure will be described with reference to the drawings. As shown in FIG. 1, a DUT 2 that is a semiconductor device as an object to be inspected, a protection diode 3a as a protection element 3 and a switching element 4a as a switch 4 are connected in series with a power source 1.

In the present embodiment, the DUT 2 consists of the diode. The protection diode 3a has higher breakdown resistance than the DUT 2. An N-channel-type IGBT having a gate electrode, a collector electrode and an emitter electrode is employed as the switching element 4a.

A cathode electrode of the DUT 2 is connected to a positive electrode of the power source 1. An anode electrode of the DUT 2 is connected to a cathode electrode of the protection diode 3a. An anode electrode of the protection diode 3a is connected to the collector electrode of the switching element 4a. The emitter electrode of the switching element 4a is connected to a negative electrode of the power source 1 (i.e., ground).

The inspection circuit includes a coil 5 that is arranged in parallel with the DUT 2 and the protection diode 3a. That is, the coil 5 is arranged so as to provide a loop path together with the DUT 2 and the protection diode 3a when the switching element 4a is turned off. In other words, the coil 5 is arranged between a connection portion of the positive electrode of the power source 1 and the cathode electrode of the DUT 2 and a connection portion of the anode electrode of the protection diode 3a and the collector electrode of the switching element 4a. Furthermore, the inspection circuit includes a smooth capacitor 6 that is arranged in parallel with the DUT 2, the protection diode 3a, the coil 5 and the switching element 4a.

Although not illustrated, the inspection circuit includes, for example, an ammeter detecting current flowing in the DUT 2 and a voltmeter detecting voltage applied to the DUT 2. Hereinabove, the inspection circuit according to the first embodiment is described. Next, an inspection method employing the above inspection circuit will be described while comparing with an inspection circuit that does not have the protection diode 3a.

Basically, in the above inspection circuit, characteristics of the DUT 2 are inspected by inputting a driving signal to the gate electrode of the switching element 4a, controlling on and off of the switching element 4a and varying current and voltage of the DUT 2, the driving signal being a pulsed signal having predetermined amplitude and frequency.

Figure 2:
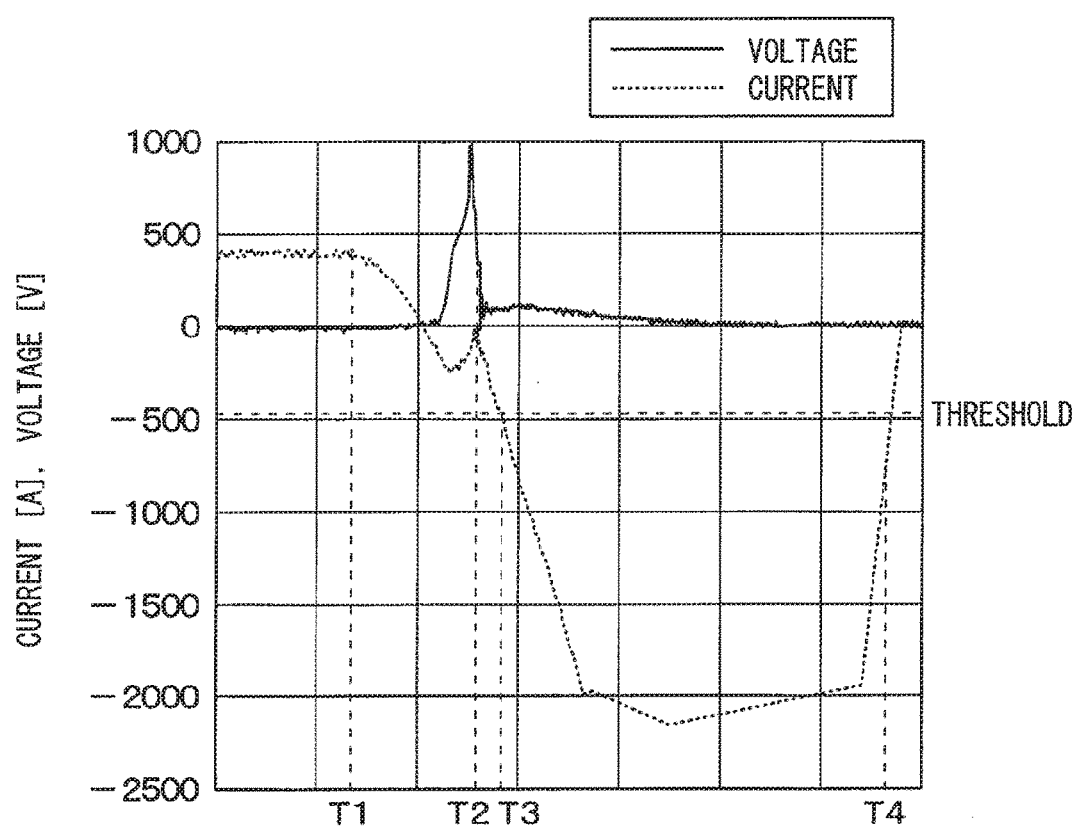
FIG. 2 is a diagram illustrating relationship between current flowing in DUT and voltage applied to DUT in an inspection circuit without a protection diode.
Figure 3:
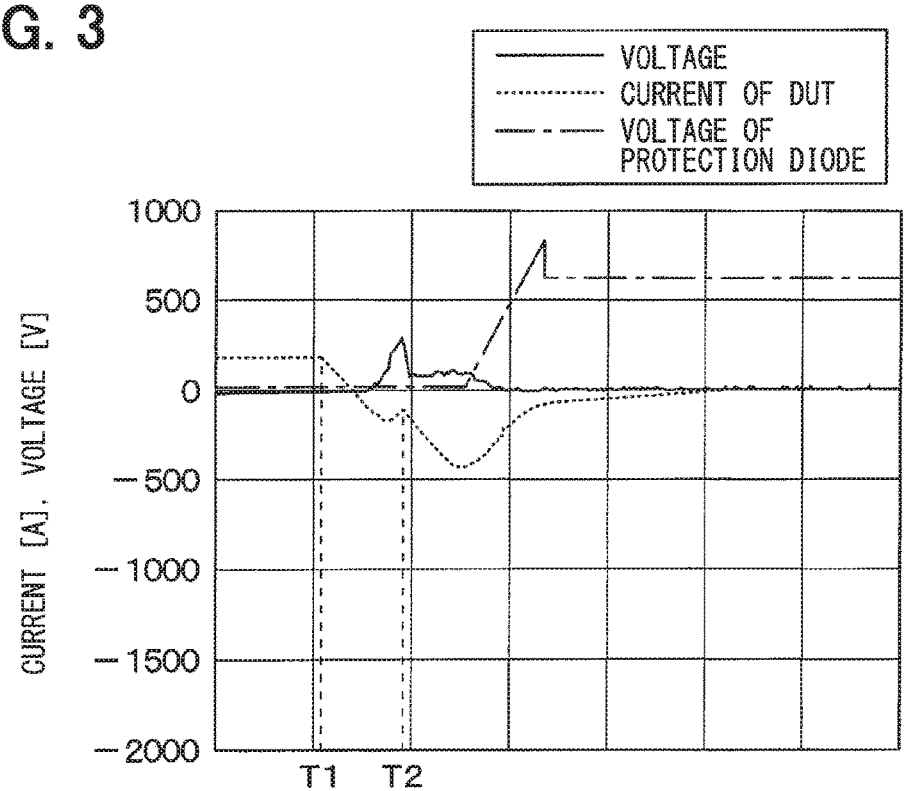
FIG. 3 is a diagram illustrating relationship between current flowing in DUT and voltage applied to DUT in the inspection circuit shown in FIG. 1.

In this case, as shown in FIG. 2 and FIG. 3, when the switching element 4a is turned on at a time point T1, current flowing in the DUT 2 (i.e., forward current) gradually decreases and recovery current (i.e., backward current) is generated. In the conventional inspection circuit that does not have the protection diode 3a, has a switch between the power source 1 and the DUT 2 and controls the off of the switch based on current flowing in the DUT 2, as shown in FIG. 2, short-circuit current is generated and absolute value of the short-circuit current precipitously increases after the DUT 2 is broken at a time point T2. For example, when a threshold current is set to be around −500 A (shown by a dot-line in FIG. 2), the breaking of the DUT 2 is detected at a time point T3. That is, time period from the time point T2 to the time point T3 corresponds to delay time from the breaking to the detection. Generally, it takes several micro seconds between when the current larger than the threshold current is detected and when the switch is turned off. There is a possibility that the connection between the power source 1 and the DUT 2 is disconnected at a time point T4. Accordingly, in the conventional inspection circuit, there is a possibility that the switch is not turned off when the largest current flows and the inspection device is damaged.

Conversely, in the present embodiment, the protection diode 3a having higher breakdown resistance than the DUT 2 is arranged between the DUT 2 and the switching element 4a. As shown in FIG. 3, even when the DUT 2 is broken at a time point T2, the protection diode 3a restricts the absolute value of the short-circuit current flowing in the DUT 2 from increasing precipitously. That is, large current is restricted from flowing in the DUT 2. As such, the inspection device is restricted from being damaged.

As described in above, the protection diode 3a restricts the large current from flowing in the DUT 2 even when the DUT 2 is broken. However, there is another possibility that, due to the protection diode 3a, voltage applied to the DUT 2 for the inspection decreases and the inspection is not executed in a state where desired voltage is applied to the DUT 2.

Figure 4:
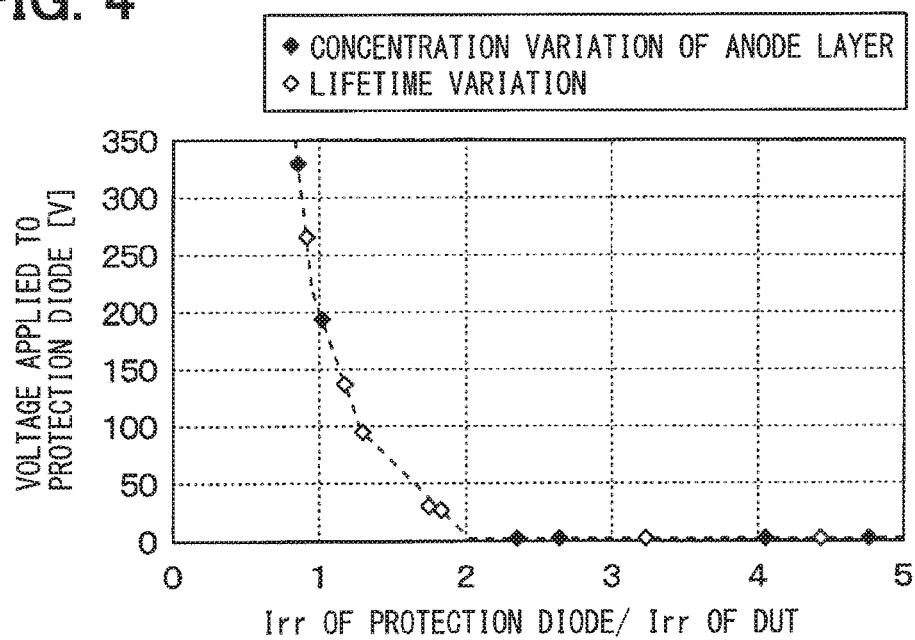
FIG. 4 is a diagram illustrating relationship between a ratio of Irr of the protection diode to Irr of the DUT and voltage applied to the protection diode.

The inventers examined a relationship between the voltage applied to the DUT 2 and the voltage applied to the protection diode 3a. Although specific basis is not figured out, as shown in FIG. 4, the inventers found that the voltage applied to the protection diode 3a is reduced to be almost zero when a ratio of Irr of the protection diode 3a to Irr of the DUT 2 (i.e., Irr of protection diode 3a/Irr of DUT 2) is equal to or more than 2. The Irr represents a peak value of recovery current. FIG. 4 illustrates a simulation result when the DUT 2 is not broken and the voltage of the power source 1 is set to be 400V.

Accordingly, in the present embodiment, the ratio of the Irr of the protection diode 3a to the Irr of the DUT 2 is equal to or more than 2. The Irrs of the DUT 2 and the protection diode 3a are appropriately modified by, for example, varying concentration of the anode layer of the diode or varying total amount of lifetime killer in the diode to vary the lifetime of carrier. However, as shown in FIG. 4, even when the Irrs are modified, the voltage applied to the protection diode 3a is reduced to be almost zero when the ratio of Irr of the protection diode 3a to the Irr of the DUT 2 is equal to or more than 2.

As described above, in the present embodiment, the protection diode 3a having higher breakdown resistance than the DUT 2 is connected in series with the DUT 2. Even when the DUT 2 is broken, the absolute value of the short-circuit current flowing in the DUT 2 is restricted from increasing precipitously and the inspection device is restricted from being damaged.

The ratio of the Irr of the protection diode 3a to the Irr of the DUT 2 is equal to or more than 2. The voltage applied to the DUT 2 is restricted from decreasing and accuracy of the inspection is restricted from decreasing.

(Second Embodiment)

The second embodiment of the present disclosure will be described. In the second embodiment, arrangements of the DUT 2, the protection diode 3a and the switching element 4a are modified compared to the first embodiment. Since the other parts of the second embodiment are similar to the first embodiment, descriptions thereof will be omitted.

Figure 5:
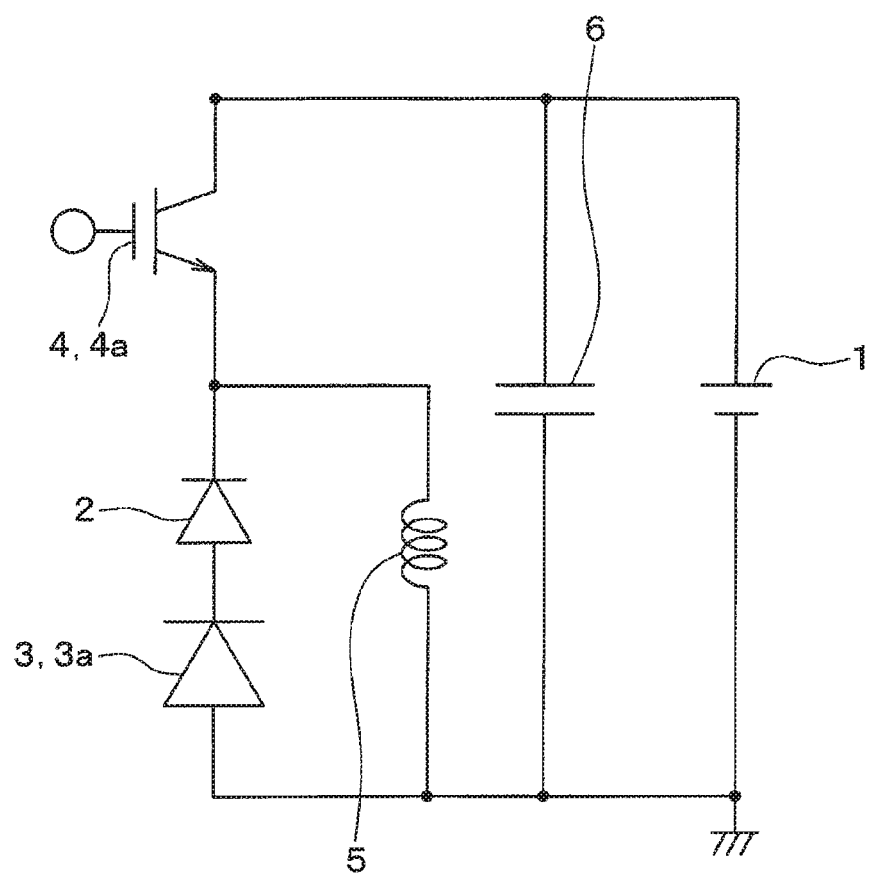
FIG. 5 is a diagram illustrating an inspection circuit according to a second embodiment of the present disclosure.

In the second embodiment, as shown in FIG. 5, the collector electrode of the switching element 4a is connected to the positive electrode of the power source 1 and the emitter electrode of the switching element 4a is connected to the cathode electrode of the DUT 2. The anode electrode of the protection diode 3a is connected to the negative electrode of the power source 1 (i.e., ground)

In such an inspection circuit in which the arrangements of the switching element 4a, the DUT 2 and the protection diode 3a are modified, similar effects to the first embodiment are achieved.

(Third Embodiment)

A third embodiment of the present disclosure will be described. In the third embodiment, structures of the DUT 2, the protection diode 3a and the switching element 4a are modified compared to the second embodiment. Since the other parts of the third embodiment are similar to the first embodiment, descriptions thereof will be omitted.

Figure 6:
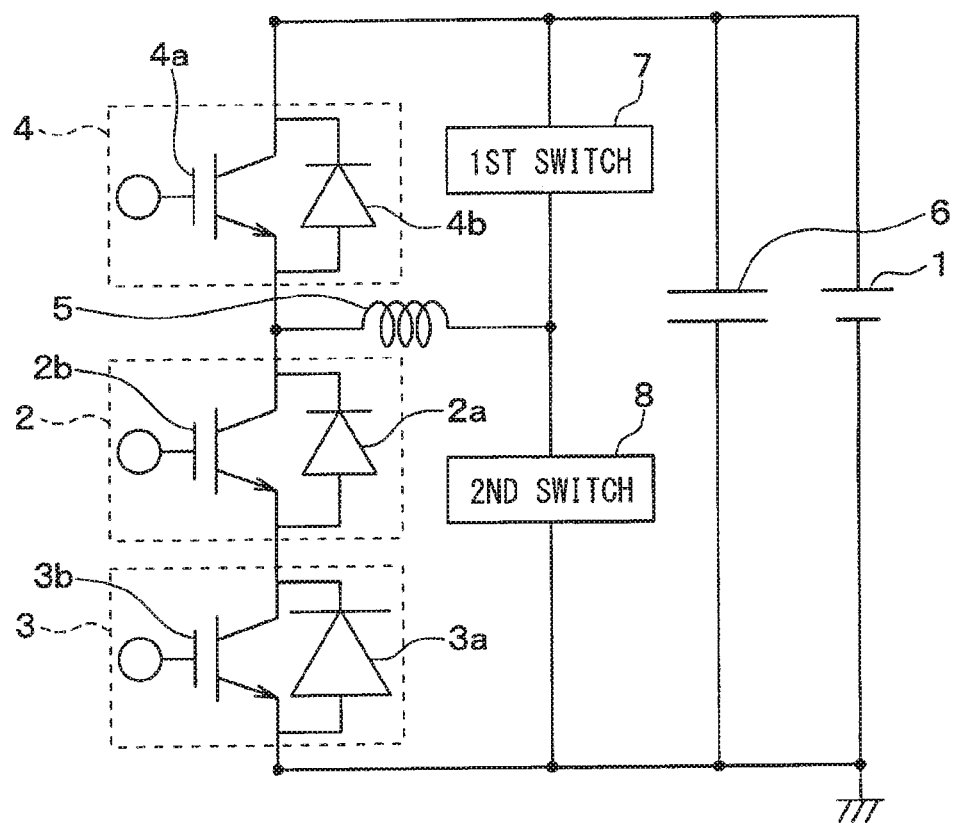
FIG. 6 is a diagram illustrating an inspection circuit according to a third embodiment of the present disclosure.

In the third embodiment, as shown in FIG. 6, DUT 2 includes a diode 2a and a switching element 2b connected in parallel with the diode 2a. Similarly, the protection element 3 includes a protection diode 3a and a switching element 3b connected in parallel with the protection diode 3a. The switch 4 includes a diode 4b and a switching element 4a connected in parallel with the diode 4b.

In the third embodiment, each switching element 2b, 3b and 4a is an IGBT element. A cathode electrode of each diode 2a, 3a and 4b is correspondingly connected a collector electrode of each switching element 2b, 3b and 4a. An anode electrode of each diode 2a, 3a and 4b is correspondingly connected an emitter electrode of each switching element 2b, 3b and 4a. Each diode 2a, 3a and 4b and each switching element 2b, 3b and 4a of the DUT 2, the protection element 3 and the switch 4 may have one chip structure arranged on a common semiconductor substrate and may have different chip structure arranged on different semiconductor substrates.

A first switch 7 and a second switch 8 are arranged in parallel with the switch 4, the DUT 2 and the protection element 3. The coil 5 is arranged to connect a connection portion between the first switch 7 and the second switch and a connection portion between the switch 4 and the DUT 2. That is, the coil 5 is arranged so as to provide a loop circuit together with the DUT 2 and the protection element 3 when the switching element 4a is turned off. The first switch 7 and the second switch 8 include switching elements such as IGBT elements and MOS elements.

In such an inspection circuit, characteristics of the DUT 2 are inspected by controlling on and off of each switching element 2b, 3b, and 4a of the DUT 2, the protection element 3 and switch 4, the first switch 7 and the second switch 8, and varying the current and voltage of the DUT 2.

That is, when characteristics of the diode 2a of the DUT 2 are mainly inspected, driving of the switching element 4a is controlled under a condition in which the first switch 7 is turned off, the second switch 8 is turned on, and the switching elements 2b and 3b of the DUT 2 and the protection element 3 are turned off. When characteristics of the switching element 2b of the DUT 2 are mainly inspected, driving of the switching element 2b of the DUT 2 is controlled under a condition in which the first switch 7 is turned on, the second switch 8 is turned off, and the switching element 3b of the protection element 3 is turned on.

As described in above, even when the DUT 2 includes the diode 2a and the switching element 2b, the protection diode 3a provides similar effects to the above first embodiment.

(Other Embodiment)

The present disclosure is not limited to the above described embodiments and may be suitably modified.

For example, in the above embodiments, the switching elements 2b, 3b, and 4a may be MOS elements and the like, instead of the IGBT elements.

In the first embodiment, the protection diode 3a may be arranged adjacent to the positive electrode of the power source 1. Similarly, in the second embodiment, the protection diode 3a may be arranged adjacent to the switch 4. Furthermore, in the third embodiment, the switch 4 may be connected to the negative electrode of the power source 1 (i.e., ground). Namely, the arrangements of the DUT 2, the protection element 3 and the switch 4 may be suitably modified.

In the above embodiments, as conventionally, a switch may be arranged between the DUT 2 and the power source 1 to disconnect the connection between the DUT 2 and the power source 1 when the DUT 2 is broken.

In the above embodiments, the ratio of the Irr of the protection diode 3a to the Irr of the DUT 2 does not have to be equal to or more than 2. Even in such an inspection circuit, the protection diode 3a having higher breakdown resistance than the DUT 2 restricts the inspection device from being damaged. While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments and examples according to the present disclosure is provided for illustration only, and not for the purpose of limiting the disclosure as defined by the appended claims and their equivalents.

The invention claimed is:

1. A circuit for inspecting a semiconductor device comprising:
   the semiconductor device that is an object to be inspected and includes a diode;
   a protection element that is connected in series with the semiconductor device and includes a protection diode having higher breakdown resistance than the diode of the semiconductor device;
   a switch that includes a switching element connected in series with the semiconductor device and the protection element; and
   a coil that provides a loop path together with the semiconductor device and the protection element when the switching element is turned off.

2. The circuit for inspecting the semiconductor device according to claim 1, wherein
   a ratio of a peak value of a recovery current of the protection diode to a peak value of a recovery current of the diode of the semiconductor device is equal to or more than two.

3. A method for inspecting a semiconductor device that is an object to be inspected and includes a diode, the method comprising:
   arranging a protection element and a switch in series with the semiconductor device, the protection element including a protection diode having higher breakdown resistance than the diode of the semiconductor device, and the switch including a switching element;
   arranging a coil to provide a loop path together with the semiconductor device and the protection element when the switching element is turned off; and
   repeating turning on and off of the switching element.

* * * * *